United States Patent
Jensen et al.

[11] Patent Number: 5,998,867
[45] Date of Patent: *Dec. 7, 1999

[54] RADIATION ENHANCED CHIP ENCAPSULANT

[75] Inventors: Ronald J. Jensen, Bloomington; Richard K. Spielberger, Maple Grove; Toan Dinh Nguyen, Brooklyn Park, all of Minn.; William F. Jacobsen, Chattanooga, Tenn.

[73] Assignee: Honeywell Inc., Minneapolis, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/606,125

[22] Filed: Feb. 23, 1996

[51] Int. Cl.$^6$ ............ H01L 23/06; H01L 23/552; H05K 9/00; H01B 7/18
[52] U.S. Cl. .......... 257/729; 257/659; 257/660; 257/788; 257/789; 257/790; 174/104; 361/816
[58] Field of Search ............ 257/729, 787, 257/789, 790, 788, 795, 660, 662, 659, 763, 792; 361/816; 174/104, 50.59

[56] References Cited

U.S. PATENT DOCUMENTS

| | | |
|---|---|---|
| 4,639,826 | 1/1987 | Val et al. ............ 361/272 |
| 4,717,948 | 1/1988 | Sakai et al. ............ 257/786 |
| 5,021,359 | 6/1991 | Young et al. ............ 437/21 |
| 5,153,379 | 10/1992 | Guzuk et al. ............ 174/35 |
| 5,159,629 | 10/1992 | Double et al. ............ 380/4 |
| 5,166,772 | 11/1992 | Soldner et al. ............ 257/659 |
| 5,220,192 | 6/1993 | Owens et al. ............ 257/519 |
| 5,324,952 | 6/1994 | Cummings ............ 250/515.1 |
| 5,371,404 | 12/1994 | Juskey et al. ............ 257/659 |
| 5,406,117 | 4/1995 | Diugokecki et al. ............ 257/659 |
| 5,436,203 | 7/1995 | Lin ............ 257/701 |
| 5,635,754 | 6/1997 | Strobel et al. ............ 257/708 |

FOREIGN PATENT DOCUMENTS

| | | | |
|---|---|---|---|
| 54-128276 | 4/1979 | Japan ............ | 257/795 |
| 1119764 | 7/1968 | United Kingdom ............ | 257/789 |

*Primary Examiner*—Mahshid D. Saadat
*Assistant Examiner*—Jhihan B. Clark
*Attorney, Agent, or Firm*—Gregory A. Bruns

[57] ABSTRACT

A shielding apparatus for an electronic component includes a first insulative encapsulant surrounding at least a portion of the component and a second encapsulant surrounding said first encapsulant and having conductive particles dispersed therein for absorbing ionizing radiation.

37 Claims, 2 Drawing Sheets

RADIATION ENHANCED CHIP ENCAPSULANT

BACKGROUND OF THE INVENTION

The present invention relates generally to radiation shielding and, in particular, to an apparatus for shielding an electronic component against space environment radiation.

Advances in commercial off-the-shelf microelectronics offer lower cost, reduced weight, i.e., smaller lift vehicles, and increased availability for military and commercial satellite systems. To take advantage of commercial off-the-shelf devices, the significant issue of radiation tolerance must be addressed. The effects of the natural space radiation environment on electronics can be divided into two main categories:

1) Total ionizing dose irradiation is caused by trapped electrons and protons in the earth's magnetosphere. This phenomena creates charge build up in the oxide and other materials used to process semiconductor devices, affecting circuit operating performance, leakage current, and other parametric and functional characteristics. The total ionizing dose is dependent on the altitude of a satellite. Even prolonged operation in a Low Earth Orbit (LEO) can present significant problems for non-hardened devices, which can fail at radiation levels less than 10 krads. A minimum total ionizing radiation requirement of 30 kreds is typical for LEO satellite hardness. Third world nuclear threats are also of concern for LEO environments. Low yield fission weapons can release a substantial amount of ionizing radiation (electron cloud) in the LEO Van Allen Belts, causing premature degradation and failure due to accumulation of total dose radiation from beta electrons.

2) Single Event Upset (SEU) is caused by the impact of heavy ions from galactic cosmic rays (GCR) or solar energetic particle (SEP) events. This phenomena will deposit charge in semiconductor devices, causing devices to upset, burnout or latchup. Protection against this type of radiation requires specialized rad-hard processes and designs in the fabrication of devices, or system-level error detection, correction and/or recovery methods. Shielding is not effective against this type of radiation.

Current approaches for hardening ICs against total dose radiation involve: (1) design and process modifications to achieve radiation hardening in the semiconductor devices, or (2) shielding of microelectronic packages, card assemblies, or satellite skins with metal of sufficient thickness to absorb the radiation. For example, it has been proposed to shield a group of circuit boards by placing a tantalum skin around them. It has also been proposed to shield individual chips by placing a first piece of tungsten over the chip and a second piece below the chip. The first approach results in a significant cost increase for the ICs, and limits the availability to a few suppliers of radiation hardened ICs. The second approach results in a significant increase in the weight of the system, as well as increased costs relative to conventional packaging approaches. The use of shielded IC packages is also limited to expensive, military qualified, ceramic packages. Thus, a need exists for a low cost, lightweight method of enhancing the radiation tolerance of ICs for a variety of space environments. Ideally, this method can be universally applied to a variety of ICs and packaging approaches.

SUMMARY OF THE INVENTION

The present invention solves these and other needs by providing a shielding apparatus including a first layer of an initially flowable or formable material contacting and surrounding at least a portion of said semiconductor die and a second layer of initially flowable second material covering said second material and having particles dispersed in it of a third material having the capacity for absorbing ionizing radiation.

DETAILED DESCRIPTION

Figure 1:
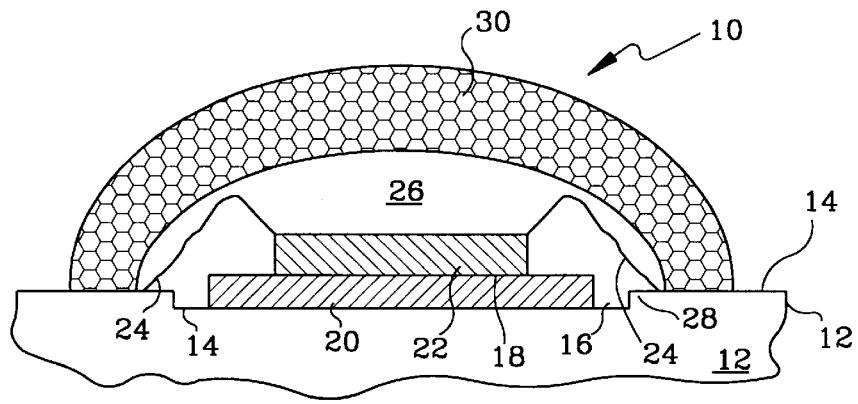
FIG. 1 shows a sectional view of a shielding apparatus according to the teachings of the present invention.

An apparatus for shielding an electronic component is shown in the drawings and is generally designated 10. A substrate or semiconductor die package portion 12 includes an upper surface 14 and may include a die receiving cavity 16. When packaging die 18 for use in non radiation environments, die 18 could be mounted on surface 14 using known die bonding methods. For use in radiation environments, according to the preferred teachings of the present invention, a die shield 20 would be mounted in cavity 16. Die shield 20 preferably should be made of a material having a high atomic number, i.e., a high Z material. Metals such as tantalum, tungsten, lead, platinum, gold, and various other materials would meet this requirement, and tantalum or tungsten appear to be reasonable economic choices. Materials such as tantalum or tungsten are capable of taking the energy out of ionizing radiation and absorbing the ionizing radiation. Die shield 20 may be, for example, a tantulum metal preform. Die or chip 18 would then be mounted on die shield 20. Wires 24 are used for electrical connections from chip 18 to package bonding pads and conductors within package portion or substrate 12 that are not shown. Standard die attach and wire bond assembly procedures would be used.

Apparatus 10 includes a two part shielding system which will now be described. Following the wirebonding operation, an electrically insulating layer 26 of a polymer coating is deposited as an inner shield or inner encapsulant directly over die 18, wires or conductors 24 and bond pads (not shown) and conductive traces (not shown)on package surface 14. Layer 26 is a material of the type commonly used as a "glop top" type encapsulant. Materials such as epoxies, siloxane polyimides or silicones are suitable for stress buffer layer 26.

Following the application of and curing of stress buffer layer 26 according to known methods, loaded encapsulant 30 is applied as an outer shield or outer encapsulant. Loaded encapsulant 30 preferably uses the same polymer base or carrier as was used for stress buffer layer 26 to minimize any thermal mismatch at the interface 32 between stress buffer layer 26 and loaded encapsulant layer 30. Polymers selected for layer 26 and layer 30 should at least have similar thermal expansion coefficients. The loading of loaded encapsulant 30 will depend on the properties desired and will represent a trade off between shielding requirements, ease or difficulty of processing, and electrical and mechanical properties. The loading material preferably will have a high atomic number (high Z) to achieve the desired shielding effect, with less thickness, by the interaction of radiation with the high Z material. Preferably materials such as tantalum or tungsten would be used as the loading material, although any metal having the capacity for absorbing ionizing radiation could be used. The size and shape of the particles of the material used for loading encapsulant 30 is critical. The size and shape properties will affect the flow and workability of loaded encapsulant 30 as well as the effectiveness of apparatus 10 in shielding a semiconductor die from radiation. Particles used for loading may be, for example, spherical or may be various irregular shapes. Particles may be mixed with the polymer or carrier according to known methods. Particle sizes in the range of 2 to 10 microns would be typical. Application of stress buffer layer 26 and loaded encapsulant 30 may be by syringe or using other known dispensing equipment. Initial metal loading is anticipated to be in the range of 70–90% by weight, which will provide 70–90% of the effectiveness of a solid metal shield. For example, a solid tungsten shield 17 mils thick provides about a 10 times enhancement in total dose tolerance.

Figure 1A:
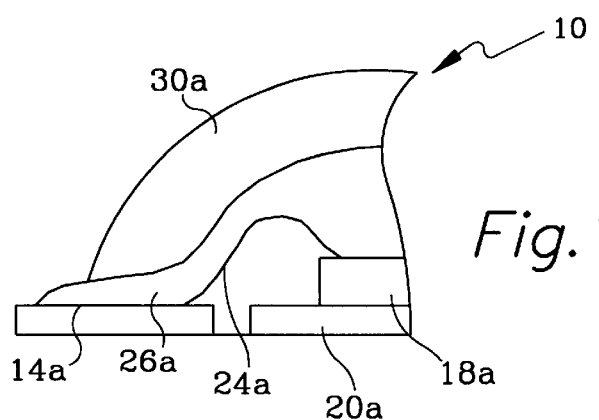
FIG. 1a shows a sectional view of an alternate embodiment of the apparatus of FIG. 1.

Loaded encapsulant 30 will include conductive particles, but encapsulant 30 may be conductive or may be insulative. When encapsulant 30 is conductive, then stress buffer layer 26a needs to extend over bond pads and any conductive traces or leads on surface 14a as shown in FIG. 1a. Loaded encapsulant 30a will then not contact bond pads and conductive traces on surface 14a. When encapsulant 30 is insulative, then it may be applied over bond pads and conductive traces as shown in FIG. 1. When encapsulant 30 is conductive, then it cannot be applied over bond pads and conductive traces. Therefore, stress buffer layer 26a needs to extend over wires 24 and any bond pads and conductive traces in area 28 of FIG. 1a so that they are insulated from encapsulant 30a. Loaded encapsulant 30 may be made insulative by increasing the volume of polymer or by using, for example, ceramic or other insulative particles to keep the conductive tantalum or tungsten particles somewhat separated. The insulative characteristics needed will depend on the specific application. For example, $10^6$ ohm-cm may be accepted in some applications and much higher resistivities may be required in other applications. In operation, loaded encapsulant 30 of apparatus 10 when struck by ionizing radiation will drain energy from ionizing radiation and absorb it. Loaded encapsulant 30 may be provided with an electrical connection to ground depending on the particular packaging configuration and size. When apparatus 10 is subjected to ionizing radiation, secondary electrons, typically from the outer shell of the tantalum or tungsten, may be emitted. Stress buffer layer 26 acts to trap these secondary electrons before they reach die 18.

Figure 2:
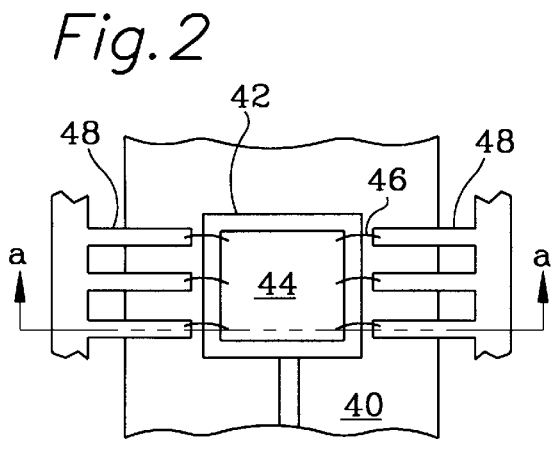
FIG. 2 is a plan view of an alternate embodiment of the present invention.

Apparatus 10 is applicable to various package types. FIG. 2 shows a top plan view of a portion of a transfer molded plastic package 40 including a metal die paddle 42, semiconductor die 44, wire bonds 46 and lead frame portions 48.

Figure 2A:
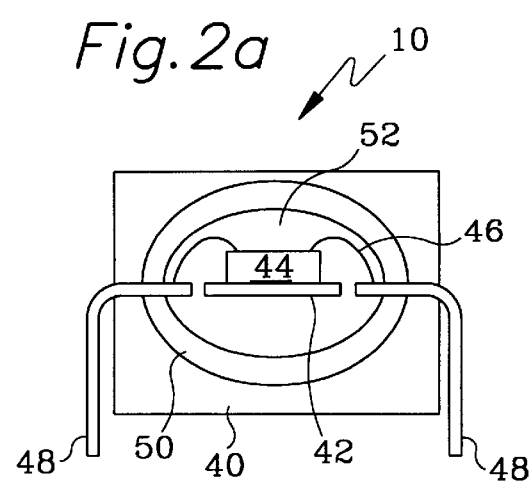
FIG. 2a is a sectional drawing of FIG. 2 along section line a—a.

FIG. 2a shows a cross-section of FIG. 2 along section line a—a. In FIG. 2a, electrically insulating stress buffer layer 52 completely surrounds paddle 42 and semiconductor die 44. Loaded encapsulant 50 then completely surrounds stress buffer layer 52 and shields both sides of die 44. The assembly can then be plastic transfer molded. An alternative to loaded encapsulant 50 completely surrounding the die is to use a high Z metal preform beneath die 44.

Figure 3:
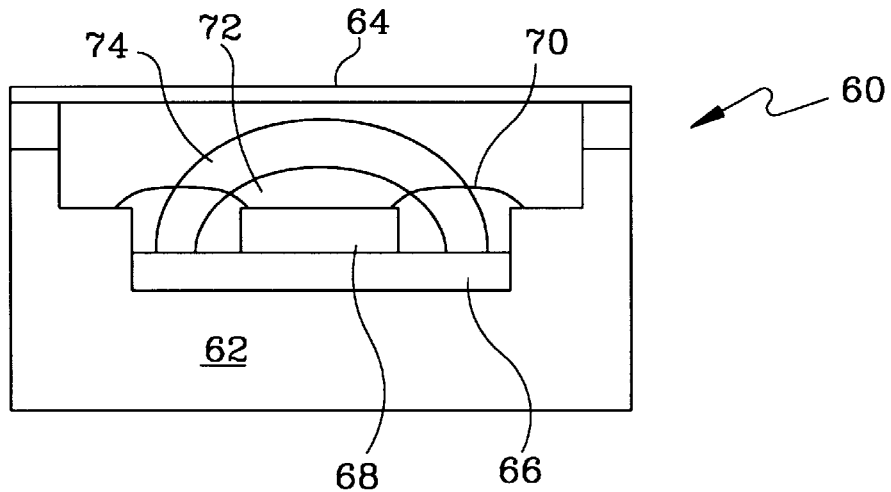
FIG. 3 is a sectional drawing of an alternate embodiment of the present invention.

In another alternate embodiment, FIG. 3 shows a cross-sectional drawing of ceramic package 60 including a base 62 and lid 64. A layer of loaded encapsulant 66 is deposited in the cavity of base 62 and chip 68 rests on encapsulant 66. Wirebonds 70 connect chip 68 to conductors within base 62. Electrically insulating stress buffer layer 72 covers chip 68. Loaded encapsulant 74 covers buffer layer 72. In this configuration, encapsulant 74 must be insulative as it is in contact with wires 70. Ceramic package 60 could be a standard military cofired ceramic package that is hermetically sealed with welded metal lid 64. A metal preform could be used under chip 68 in lieu of loaded encapsulant layer 66.

Figure 4:
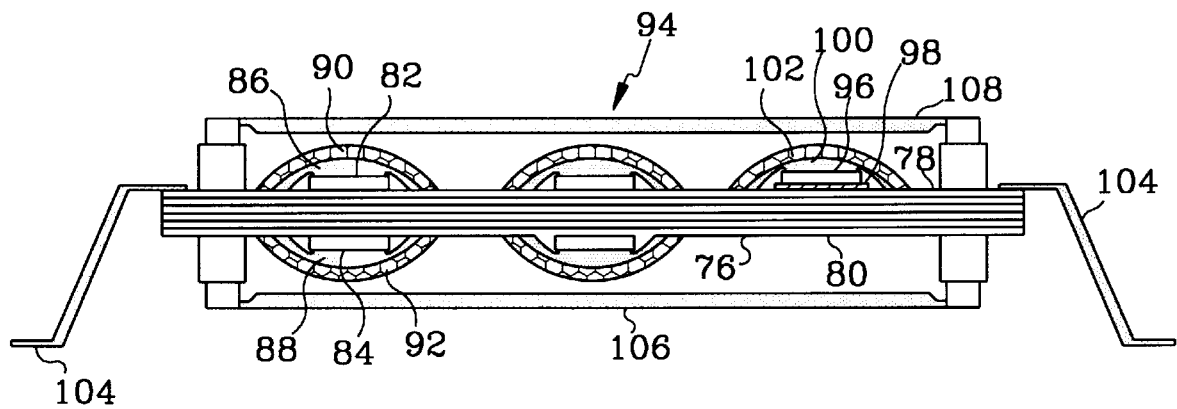
FIG. 4 is a sectional drawing of an alternate embodiment of the present invention.

An additional alternate embodiment of apparatus 10 is shown in FIG. 4 which shows a double sided multi chip module (MCM) with substrate 76 being, for example, of cofired ceramic, including conductive paths within and having upper surface 78 and lower surface 80. Die 82 is mounted on surface 78 and die 84 is mounted on opposite surface 80 and aligned with die 82. After wirebonding, a first stress buffer layer 86 and 88 is applied over die 82 and die 84 respectively. Then loaded encapsulant layers 90 and 92 are applied over stress buffer layers 86 and 88 respectively. In this embodiment, loaded encapsulant layer 90, for example, provides shielding for both chip 82 and chip 84. Mounting arrangement 94 is identical to the arrangement just described. Die 96 is mounted on a shield 98 and then has stress buffer layer 100 and loaded encapsulant 102 applied. Conductive paths within substrate 76 interconnect chips mounted on substrate 76 and also connect to leads 104. FIG. 4 also shows covers 106 and 108.

The present invention provides an innovative approach to enhancing total dose radiation tolerance in packaged electronic components by eliminating heavy external shielding at the system and package level. As described herein, a polymeric encapsulant preferably loaded with a high Z material is deposited directly on the ICs which are first protected with an insulating stress buffer encapsulant. The loaded encapsulant acts as a local radiation shield against total dose accumulation. This results in a commercial die made radiation tolerant with minimum cost and low weight due to localized shielding. The shielding apparatus of the present invention may be used in ceramic, metal or plastic packages in single chip or multichip configurations.

The scope of the invention is to be indicated by the appended claims rather than the foregoing description.

We claim:

1. Apparatus for shielding a semiconductor die mounted on a surface from ionizing radiation, comprising:
    a first layer of initially flowable first material contacting and surrounding at least a first portion of said die;
    a second layer of initially flowable second material covering said first layer, said second material having dispersed therein particles of a metal, having a capacity for absorbing ionizing radiation; and
    ionizing radiation shielding means located to shield a second portion of said die.

2. Apparatus of claim 1 wherein said ionizing radiation shielding means comprises a metal die shield interposed between said surface and said die, and wherein conductors extend from said die and said first material covers said die and said conductors.

3. Apparatus of claim 1 wherein said first material and said second material are polymers and have similar thermal expansion coefficients.

4. Apparatus of claim 1 wherein said metal is tantalum.

5. Apparatus of claim 1 wherein said metal is tungsten.

6. Apparatus of claim 1 wherein said surface is a first surface of a substrate having an opposite surface and a second die is mounted at said opposite surface and aligned with said die and said first layer and said second layer are applied to said second die.

7. Apparatus of claim 1 wherein said surface is included in a package configuration which allows said first material to substantially surround said die.

8. Apparatus of claim 1 wherein said surface is a surface of a printed wiring board.

9. Apparatus of claim 1 wherein said surface is a surface of a printed circuit board.

10. Apparatus of claim 1 wherein said second layer of material is insulative and is in contact with conductors extending from said die.

11. Apparatus of claim 1 wherein said surface is located in a multichip module.

12. Apparatus of claim 1 wherein said surface is located in a single chip package.

13. Apparatus of claim 6 wherein said first material and said second material are polymers and have similar thermal expansion coefficients.

14. Apparatus of claim 7 wherein said metal is selected from the group consisting of tantalum, tungsten, lead, gold and platinum.

15. Apparatus of claim 8 wherein said metal is selected from the group consisting of tantalum, tungsten, lead, gold and platinum.

16. Apparatus for shielding a semiconductor die mounted on a surface, comprising:
   a first formable electrically insulating encapsulant covering said die and a first portion of said surface;
   a second formable encapsulant covering said first encapsulant and a second portion of said surface, said second encapsulant having dispersed therein particles of a material having a capacity for absorbing ionizing radiation; and
   ionizing radiation shielding means located to shield an uncovered portion of said die.

17. Apparatus of claim 16 further comprising a shield interposed between said surface and said die.

18. Apparatus of claim 16 wherein said shield is formed of a metal selected from the group consisting of tantalum, tungsten, lead, gold and platinum.

19. Apparatus of claim 16 wherein said surface is included in a package configuration which allows said first material to substantially surround said die.

20. Apparatus for shielding a semiconductor die mounted on a surface from ionizing radiation, comprising:
   a first layer of initially flowable first material contacting and surrounding at least a first portion of said die;
   a second layer of initially flowable second material covering said first layer, said second material having dispersed therein particles of a metal, having an atomic number of 70 or greater; and
   ionizing radiation shielding means located to shield a second portion of said die.

21. Apparatus of claim 20 wherein said ionizing radiation shielding means comprises a metal die shield interposed between said surface and said die, and wherein conductors extend from said die and said first material covers said die and said conductors.

22. Apparatus of claim 20 wherein said first material and said second material are polymers and have similar thermal expansion coefficients.

23. Apparatus of claim 20 wherein said metal is tantalum.

24. Apparatus of claim 20 wherein said metal is tungsten.

25. Apparatus of claim 20 wherein said surface is a first surface of a substrate having an opposite surface and a second die is mounted at said opposite surface and aligned with said die and said first layer and said second layer are applied to said second die.

26. Apparatus for shielding a semiconductor die mounted at a surface from ionizing radiation comprising:
   a first layer of an initially flowable material having dispersed therein particles of a metal having a capacity for absorbing ionizing radiation, said first layer covering at least a portion of said die, said particles being sufficiently separated within said initially flowable material so that said first layer is electrically insulative.

27. Apparatus of claim 26 wherein conductors extend away from said die and said first layer is in contact with said conductors.

28. Apparatus of claim 27 wherein said particles of metal are selected from the group consisting of tantalum, tungsten, lead, gold and platinum.

29. Apparatus of claim 28 wherein said initially flowable material comprises insulative particles to keep said particles of metal separated.

30. Apparatus for shielding a semiconductor die mounted at a surface from ionizing radiation comprising:
   a first layer of initially flowable material having dispersed therein particles of a metal having a capacity for absorbing ionizing radiation, said first layer surrounding at least a portion of said die.

31. Apparatus of claim 30 wherein said particles are sufficiently separated within said initially flowable material so that said initially flowable material is electrically insulative and located at said die.

32. Apparatus of claim 30 wherein said metal particles are selected from the group consisting of tantalum, tungsten, lead, gold and platinum.

33. Apparatus of claim 30 wherein said initially flowable material comprises insulative particles to keep said particles of metal separated.

34. Apparatus of claim 30 further comprising a second layer of initially flowable electrically insulative material interposed between said first layer and said die wherein said second layer acts as a stress buffer layer.

35. Apparatus of claim 32 wherein said surface is a first surface of a substrate having an opposite surface and a second die is mounted at said opposite surface and aligned with said die and said first layer of initially flowable material is applied to said second die with said first layer substantially aligned on opposite surfaces of said substrate.

36. Apparatus of claim 34 wherein said first layer is electrically conductive.

37. Apparatus of claim 36 wherein a loading of said particles of metal in said first layer of initially flowable material is in a range of 70 to 90 percent by weight.

* * * * *